United States Patent
Hommura et al.

(10) Patent No.: US 8,338,002 B2
(45) Date of Patent: Dec. 25, 2012

(54) SPUTTERING COMPOSITE TARGET, METHOD FOR MANUFACUTURING TRANSPARENT CONDUCTIVE FILM USING THE SAME AND TRANSPARENT CONDUCTIVE FILM-PROVIDED BASE MATERIAL

(75) Inventors: Hayato Hommura, Kanagawa (JP);
Kenji Katori, Kanagawa (JP); Go Sudo, Kanagawa (JP)

(73) Assignee: Dexerials Corporation, Osaki (JP)

( * ) Notice: Subject to any disclaimer, the term of this patent is extended or adjusted under 35 U.S.C. 154(b) by 568 days.

(21) Appl. No.: 12/478,143

(22) Filed: Jun. 4, 2009

(65) Prior Publication Data
US 2009/0305066 A1  Dec. 10, 2009

(30) Foreign Application Priority Data
Jun. 6, 2008  (JP) ................. 2008-149620

(51) Int. Cl.
B32B 18/00 (2006.01)
B32B 27/36 (2006.01)
C23C 14/08 (2006.01)
C23C 14/12 (2006.01)
C23C 14/34 (2006.01)

(52) U.S. Cl. ....... 428/701; 428/77; 428/195.1; 428/408; 428/688; 428/689; 428/698; 428/699; 428/702; 428/704; 204/192.1; 204/192.15; 204/192.26; 204/192.29; 204/298.2; 204/298.12; 204/298.13

(58) Field of Classification Search .......... None
See application file for complete search history.

(56) References Cited

U.S. PATENT DOCUMENTS

| | | | | |
|---|---|---|---|---|
| 4,345,000 A * | 8/1982 | Kawazoe et al. | ............ | 428/212 |
| 4,560,577 A * | 12/1985 | Mirtich et al. | ............ | 427/533 |
| 4,626,336 A * | 12/1986 | Bloomquist et al. | ..... | 204/298.12 |
| 4,647,548 A * | 3/1987 | Klein | ............ | 501/134 |
| 4,952,783 A * | 8/1990 | Aufderheide et al. | ........ | 219/528 |
| 5,094,787 A * | 3/1992 | Nakajima et al. | ............ | 264/674 |
| 5,160,675 A * | 11/1992 | Iwamoto et al. | ............ | 264/645 |
| 5,288,951 A * | 2/1994 | Frankenthal et al. | ........ | 174/257 |
| 5,478,456 A * | 12/1995 | Humpal et al. | ......... | 204/192.13 |
| 5,721,299 A * | 2/1998 | Angelopoulos et al. | ...... | 524/177 |
| 6,083,635 A * | 7/2000 | Jonas et al. | ............ | 428/690 |
| 6,149,840 A * | 11/2000 | Ardakani et al. | ............ | 252/500 |
| 6,217,969 B1 * | 4/2001 | Takahashi et al. | ............ | 428/64.1 |
| 6,329,044 B1 * | 12/2001 | Inoue et al. | ............ | 428/209 |
| 6,533,904 B2 * | 3/2003 | Ebisawa et al. | .......... | 204/192.15 |
| 6,674,635 B1 * | 1/2004 | Fife et al. | ............ | 361/523 |
| 6,743,488 B2 * | 6/2004 | Memarian et al. | ............ | 428/1.4 |
| 6,849,165 B2 * | 2/2005 | Kloppel et al. | .......... | 204/192.15 |
| 7,282,123 B2 * | 10/2007 | Kosyachkov | .......... | 204/192.26 |
| 7,462,302 B2 * | 12/2008 | Chang et al. | .......... | 252/506 |
| 7,727,798 B1 * | 6/2010 | Wang et al. | ............ | 438/105 |
| 7,732,054 B2 * | 6/2010 | Kim et al. | ............ | 428/446 |
| 7,790,339 B2 * | 9/2010 | Yoshikawa et al. | .......... | 430/5 |
| 7,951,442 B2 * | 5/2011 | Obata et al. | ............ | 428/64.1 |
| 2004/0104110 A1 * | 6/2004 | Lee | ............ | 204/192.1 |
| 2007/0096143 A1 * | 5/2007 | Kim et al. | ............ | 257/103 |

(Continued)

FOREIGN PATENT DOCUMENTS

JP  03-044465  2/1991

(Continued)

Primary Examiner — Vivian Chen
(74) Attorney, Agent, or Firm — Oliff & Berridge

(57) ABSTRACT

A sputtering composite target includes: an oxide based component containing indium oxide; and a carbon based component.

12 Claims, 3 Drawing Sheets

U.S. PATENT DOCUMENTS

2008/0274351 A1 * 11/2008 Itoh et al. .................. 428/337

FOREIGN PATENT DOCUMENTS

| JP | 05-222526 | 8/1993 |
| --- | --- | --- |
| JP | 2000-044236 | 2/2000 |
| JP | 2002-256424 | 9/2002 |
| JP | 2002-343150 | 11/2002 |
| JP | 2004-105054 | 4/2004 |
| JP | 2004-168636 | 6/2004 |
| JP | 2006-117967 | 5/2006 |

* cited by examiner

SPUTTERING COMPOSITE TARGET, METHOD FOR MANUFACUTURING TRANSPARENT CONDUCTIVE FILM USING THE SAME AND TRANSPARENT CONDUCTIVE FILM-PROVIDED BASE MATERIAL

BACKGROUND OF THE INVENTION

1. Field of the Invention

The present invention relates to a sputtering composite target, a method for manufacturing a transparent conductive film using the same and a transparent conductive film-provided base material. In more detail, the present invention relates to a sputtering composite target which is suitably used for manufacturing an indium oxide ($In_2O_3$) based transparent conductive film with low electrical resistance and good conductivity, a method for manufacturing a transparent conductive film using the same and a transparent conductive film-provided base material.

2. Description of the Related Art

There have hitherto been used $In_2O_3$ based (for example, $In_2O_3$—$SnO_2$ based (hereinafter referred as "ITO")) films as a transparent conductive film to be used for flat panel displays such as liquid crystal displays and plasma displays and so on. These transparent conductive films can be formed as a thin film with low electrical resistance on a substrate by a sputtering process using, for example, a sputtering target having titanium added to ITO as a raw material. On that occasion, in order to enhance electrical and optical characteristics of the film, the formation of a thin film is carried out by heating a glass-made substrate at a high temperature of about 300° C. (see Patent Document 1, JP-A-2004-168636).

However, in the case where other components such as color films and inks are used for the substrate, those having a low heat-resistant temperature are included in these other components. Therefore, a process for fabricating a transparent conductive film without heating the substrate to a high temperature is demanded. Also, in particular, in the indium oxide system, additives to be doped or oxygen vacancies largely affect conductive carriers. Therefore, research and development are being widely conducted from both the material standpoint and the process standpoint.

For example, as for an indium tungsten oxide thin film, by specifying a composition ratio of constitutional materials, it can be fabricated by heating a substrate at a relatively low temperature as 150° C. (see Patent Document 2, JP-A-2002-256424). Also, as for an indium zinc oxide thin film, there are disclosed a method of obtaining a good transparent conductive film by subjecting an obtained transparent conductive film to a heat treatment on a substrate at 200° C. in an oxygen or hydrogen atmosphere (see Patent Document 3, WO 04/105054); a method of doping aluminum or gallium to form a film and then subjecting the film to a heat treatment at not higher than 300° C. in a reducing atmosphere, thereby lowering the electrical resistance (see Patent Document 4, JP-A-2000-44236); and a method of adding a hydrogen gas in a sputtering gas and then performing a heat treatment at from 80° C. to 180° C. (see Patent Document 5, JP-A-2002-343150).

Furthermore, it is investigated to control the electrical resistance and stability by performing a treatment for the purpose of introducing oxygen vacancies in a sputtering process and steps before and after the sputtering process.

For example, as for those for focusing on a preparation method of an ITO target, there are disclosed a method in which in addition to indium oxide and tin oxide, metallic indium and metallic tin are added at the time of preparing the ITO target to regulate the oxygen content in the target at from 8 to 17% by weight, and oxygen vacancies are introduced into a thin film after the fabrication (see Patent Document 6, JP-A-05-222526); and a method in which a sintering step at the time of preparing the ITO target is carried out in vacuo or in an inert gas atmosphere or reducing gas atmosphere, thereby lowering the oxygen content in the target (see Patent Document 7, JP-A-03-44465).

Besides, as a method of obtaining an ITO thin film with low resistivity at a low temperature, there is disclosed a method in which in a DC magnetron sputtering process, energy of a molecule to be sputtered in reaching a substrate and a fabrication rate are optimized by controlling a bias voltage and a target current, thereby obtaining a thin film with low resistance under a condition under which substrate materials are placed at a relatively low temperature as not higher than 40° C. (see Patent Document 8, JP-A-2006-117967)

SUMMARY OF THE INVENTION

However, it may be necessary to carry out the fabrication or treatment at lower temperatures than those in the methods disclosed in the foregoing Patent Documents 2 to 5, depending upon components to be used for the substrate. Also, according to the heat treatment after the fabrication as disclosed in the foregoing Patent Documents 3 and 4, not only the steps are not merely increased, but when a conductive oxide thin film is formed on a plastic film, since a roll-shaped intermediate product is treated, there are encountered problems that the equipment becomes large in size and that the control of temperature distribution is difficult.

According to the method of introducing a hydrogen gas into a sputtering gas as disclosed in the foregoing Patent Document 5, a hydrogen ion is inevitably implanted into the target, and therefore, it is difficult to avoid changes in the target and atmosphere during the fabrication by the sputtering time. Furthermore, in the case of using a cryopump as a vacuum pump, it is necessary to shorten a regeneration interval of the pump by the hydrogen agent, resulting in making it difficult to achieve efficient fabrication.

Also, in the case of controlling the atmosphere at the time of preparing a sputtering target as disclosed in the foregoing Patent Documents 6 and 7, there are involved such problems to be further reviewed that the sintering density of the target per se is insufficient and that complication of the manufacturing steps is incurred. Also, in the case of preparing an oxide target containing a metallic part, it is similarly difficult to control the sintering atmosphere. Furthermore, as disclosed in the foregoing Patent Document 8, in order to control the bias voltage and the target current at the time of sputtering, a power source circuit section of the sputtering apparatus is complicated so that the apparatus becomes expensive. Thus, it is not easy to develop this technology to general apparatus.

On the other hand, under the existing circumstances, ITO is still most generally used, and studies of additives are in the insufficient stage for practical implementation. Also, following increases in size and definition of a display device, a demand for realization of low electrical resistance of the transparent conductive film is being further increased.

Thus, it is desirable to provide a sputtering composite target capable of stably introducing a fixed amount of oxygen vacancies into a transparent conductive film and capable of forming a transparent conductive film with low electrical resistance and good conductivity, a method for manufacturing an ITO transparent conductive film using the same and a transparent conductive film-provided base material.

In order to achieve the foregoing desire, the present inventors made extensive and intensive investigations. As a result, it has been found that the foregoing desire can be achieved by using indium oxide and a carbon component in combination, leading to accomplishment of embodiments of the present invention as described below.

According to an embodiment of the present invention, there is provided a sputtering composite target including an oxide based component containing indium oxide and a carbon based component.

According to another embodiment of the present invention, there is provided a method for manufacturing a transparent conductive film including the step of forming a transparent conductive film on a substrate using a sputtering composite target including an oxide based component containing indium oxide and a carbon based component.

According to a further embodiment of the present invention, there is provided a method for manufacturing a transparent conductive film including the steps of providing, as a first target, an oxide based component containing indium oxide and, as a second target, a carbon based component; disposing the first target and the second target in a different position from each other; and sputtering the first target and the second target together to form a transparent conductive film on a substrate.

According to an even further embodiment of the present invention, there is provided a transparent conductive film-provided base material including an indium oxide based transparent conductive film formed on a sheet or film of a plastic.

According to the embodiments of the present invention, since a sputtering composite target is constituted of an oxide based component containing indium oxide and a carbon based component, a stable fixed amount of oxygen vacancies can be introduced into a transparent conductive film; and an $In_2O_3$ based transparent conductive film with good transmittance, low electrical resistance and good conductivity can be obtained.

DESCRIPTION OF THE PREFERRED EMBODIMENTS

Figure 1:
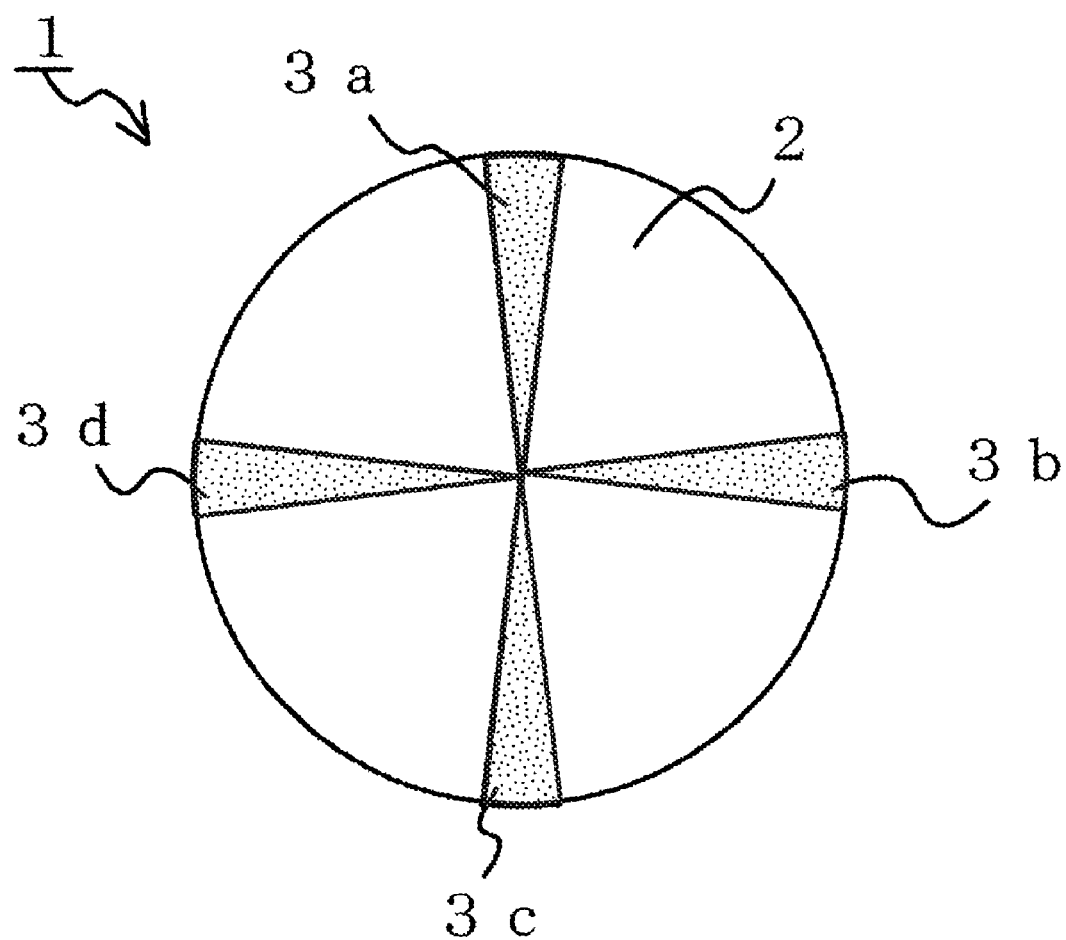
FIG. 1 is a plan view showing one example of a sputtering composite target according to an embodiment of the present invention.

A sputtering composite target, a method for manufacturing a transparent conductive film using the same and a transparent conductive film-provided base material according to embodiments of the present invention are hereunder described in detail. In the present specification, the term "%" regarding the concentrations and contents, etc. means a percentage by mass unless otherwise indicated.

The sputtering composite target according to an embodiment of the present invention includes an oxide based component containing indium oxide and a carbon based component.

The oxide based component may be one made of indium oxide or may contain compounds other than indium oxide. Examples of the oxide based component which can be used include a chip of indium oxide, a sintered body made of an indium oxide powder, a material obtained by doping this sintered body with a specified element as described later, and a sintered body obtained by mixing an indium oxide powder and an oxide powder containing a specified element as described later and sintering the mixture.

The carbon based component may be any material containing carbon, and examples thereof include a carbon powder, a carbon chip for use in sputtering, and a carbide material such as $Al_4C_3$, NbC, TaC and ZrC.

In view of the fact that the sputtering composite target includes a carbon based component, a stable fixed amount of oxygen vacancies can be introduced into the transparent conductive film.

Although a mechanism of the introduction of oxygen vacancies has not been elucidated yet, it may be assumed that in view of the fact that oxygen (O) in the oxide based component containing $In_2O_3$ is linked to C in the carbon based component and released as CO or $CO_2$, a stable fixed amount of oxygen vacancies is introduced into the transparent conductive film regardless of changes in the sputtering time and atmosphere and so on.

Since a stable fixed amount of oxygen vacancies is introduced into the transparent conductive film, and these oxygen vacancies work as a conductive carrier, a transparent conductive film with low electrical resistance and good conductivity can be obtained.

Besides the carbon based component, it had been considered to use a boron based component for the composite target. However, when the boron based component was used for the composite target, the electrical resistance of a transparent conductive film became high, and the conductivity was deteriorated.

The sputtering composite target may be an integrated body of the oxygen based component and the carbon based component or may be a separate body of the oxygen based component and the carbon based component from each other.

In the case where the oxygen based component and the carbon based component are a separate body from each other, it is preferable that these materials are sputtered together.

In the present specification, the term "together" means that the sputtering composite targets as a separate body from each other are sputtered substantially at the same time; and also means that even when a slight time deviation exists, the sputtering composite targets as a separate body from each other are sputtered in an identical reducing atmosphere.

In the case where the oxide based component and the carbon based component are a separate body from each other, for example, the foregoing sintered body can be used as the oxide based component, whereas a non-sintered body or the like can be used as the carbon based component.

Also, in the case where the oxide based component and the carbon based component are a separate body from each other, it is preferred to use a material obtained by laminating the carbon based component on at least a part of the surface of the oxide based component.

Next, an example of the sputtering composite target in which the oxide based component and the carbon based component are a separate body from each other is described.

FIG. 1 is a plan view showing one example of a sputtering composite target according to an embodiment of the present invention.

As illustrated in FIG. 1, a sputtering composite target 1 of this example includes a disc-shaped oxide based component (for example, $In_2O_3$) 2 and four sector-shaped carbon based components (for example, a carbon chip) 3a to 3d each having a prescribed angle.

The sputtering composite target 1 is one prepared by laminating, on the surface of the oxide based component 2, the four sector-shaped carbon based components 3a to 3d in a radial manner at a prescribed angle from the center thereof.

It is preferable that the carbon based components 3a to 3d are disposed on the surface of the oxide based component 2 at equal angles or equal intervals such that oxygen vacancies are equally introduced into the transparent conductive film to be formed by means of sputtering.

FIG. 1 illustrates an example in which the four sector-shaped carbon based components 3a to 3d are disposed on the surface of the disc-shaped oxide based component 2. However, it should not be construed that the number, shape and disposition manner of each of the oxide based component 2 and the carbon based components 3a to 3d are limited to those in this example.

As for the sputtering composite target 1 of this example, in the case where the maximum surface area of the oxide based component 2 is defined as a target surface area, it is preferable that an area ratio occupied by the carbon based component 3 (total area ratio of the carbon based components 3a to 3d in FIG. 1) is from 2 to 15% relative to 100% of the target surface area.

In the sputtering composite target, when the area ratio occupied by the carbon based component is less than 2%, there may be the case where the electrical resistance of the transparent conductive film obtained by using the sputtering composite target does not become low, whereby the effects to be brought using the carbon based component are not exhibited. On the other hand, when the area ratio exceeds 15%, there may be the case where carbon is taken into the transparent conductive film, and the electrical resistance of the obtained transparent conductive film becomes high, whereby the conductivity is lowered.

Next, an example of the sputtering composite target in which the oxide based component and the carbon based component are integrated is described.

In the case where the sputtering composite target is an integrated body of the oxide based component and the carbon based component, it is preferable that the carbon based component is incorporated in an amount of from 0.6 to 6.0 parts by weight based on 100 parts by weight of the oxide based component.

When the content of the carbon based component is less than 0.6 parts by weight, there may be the case where the electrical resistance of the obtained transparent conductive film does not become low so that the effects to be brought using the carbon based component are not exhibited. On the other hand, when the content of the carbon based component exceeds 6.0 parts by weight, there may be the case where carbon is taken into the transparent conductive film, and the electrical resistance of the obtained transparent conductive film becomes high so that the conductivity is lowered.

It is preferable that the sputtering composite target contains a metal element, specifically at least one element selected from the group consisting of tin (Sn), zinc (Zn), tungsten (W) and germanium (Ge).

When the sputtering composite target contains the foregoing metal element, a transparent conductive film with excellent conductivity can be obtained.

The foregoing element may be doped in the oxide based component, or a metal or an oxide each containing the foregoing element or the like may be used. Furthermore, the sputtering composite target may contain elements other than the foregoing element.

It is preferable that a proportion of the content of the foregoing element in the sputtering composite target is from 1.0 to 30.0%. For the purpose of obtaining a thermally stable transparent conductive film, the proportion of the content of the foregoing element is preferably about 10%.

Next, the method of manufacturing a transparent conductive film according to an embodiment of the present invention is described with reference to the accompanying drawings.

The method for manufacturing a transparent conductive film according to an embodiment of the present invention includes forming a transparent conductive film on a substrate using a sputtering composite target including an oxide based component containing indium oxide and a carbon based component.

Figure 2:
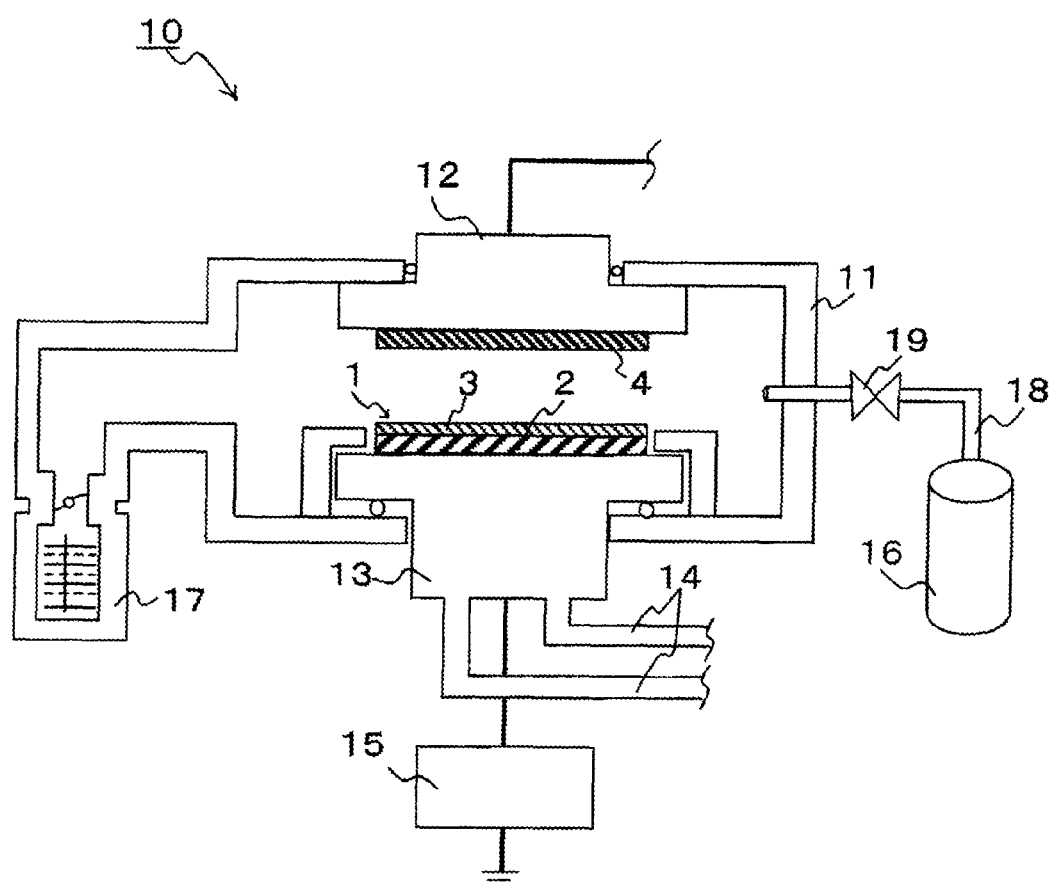
FIG. 2 is a view showing a diagrammatic configuration of a general RF magnetron sputtering apparatus.

FIG. 2 is a view showing a diagrammatic configuration of a general RF (radio-frequency) magnetron sputtering apparatus.

As illustrated in FIG. 2, in an RF magnetron sputtering apparatus 10, a substrate holder 12 for holding a substrate 4 and a target holder 13 for holding the target 1 are disposed opposite to each other within a chamber 11. A power source 15 for applying a voltage with high frequency (for example, 13.56 MHz) between the substrate 4 and the target 1 is connected to the target holder 13.

The target holder 13 is provided with a piping 14 for circulating a coolant such as cooling water as well as non-illustrated magnet and yoke.

Also, the RF magnetron sputtering apparatus 10 is provided with a gas cylinder 16 for feeding a process gas into the chamber 11 at the time of sputtering and a vacuum pump 17 for evacuating the inside of the chamber 11, such as a cryopump, in the outside of the chamber 11. The gas cylinder 16 and the chamber 11 are connected to each other through a feed piping 18; and the feed piping 18 is provided with a flow control valve 19 for controlling the feed amount of a sputtering gas.

FIG. 2 illustrates an example in which a single gas cylinder 16 is provided. However, in the case of using a sputtering gas having plural kinds of gases mixed therein, plural gas cylinders may be provided, thereby feeding the plural gases into the chamber from these gas cylinders.

The method for manufacturing a transparent conductive film using the sputtering apparatus of the example illustrated in FIG. 2 is hereunder described.

First of all, the substrate 4 is set in the substrate holder 12.

As the substrate 4, for example, a transparent glass substrate having a clean surface, or at least one kind of transparent resin substrates selected from the group consisting of polyolefins (PO) such as polyethylene (PE) and polypropylene (PP), polyethylene terephthalate (PET), polycarbonate (PC), polyethylene naphthalate (PEN) and polyethersulfone (PES) can be used.

Next, for example, the sputtering composite target 1 illustrated in FIG. 1 is set in the target holder 13. The sputtering composite target 1 is configured of, as a first target, the oxide based component 2 and, as a second target, the carbon based component 3 and provided for the use upon laminating the second target on the first target.

Subsequently, the inside of the chamber 11 is exhausted and evacuated by the vacuum pump 17.

Thereafter, the sputtering gas is introduced into the chamber 11 from the gas cylinder 16 while continuing the exhaustion, thereby regulating the inside of the chamber 11 at a fixed atmosphere pressure. It is preferred to use, for example, an Ar gas which is an inert gas, as the sputtering gas. A mixed gas of an Ar gas and optionally, an $O_2$ gas in a prescribed amount, or the like may also be used.

The gas flow rate is preferably from 5 to 50 sccm; and the gas pressure is preferably from 0.5 to 2.0 Pa.

Subsequently, a voltage with high frequency (13.56 MHz) is applied between the sputtering composite target 1 and the substrate 4 from the power source 14 via the target holder 13, thereby emitting plasma within the chamber 11 by means of RF discharge.

Then, an electric power of from 30 to 120 W, specifically 50 W is applied from the power source 14 to start sputtering without heating the substrate 4, and the sputtering is continued at room temperature (20±5° C.) for a sputtering time of 10 minutes, thereby forming a transparent conductive film having a thickness of about 200 nm on the substrate 4.

In accordance with the method for manufacturing a transparent conductive film according to an embodiment of the present invention, even in the case where the sputtering time is altered between 1 and 50 hours, an $In_2O_3$ based transparent conductive film having a low film electrical resistance as less than $8.0 \times 10^{-4}$ Ω·cm, preferably less than $6.0 \times 10^{-4}$ Ω·cm, and specifically not more than $4.0 \times 10^{-4}$ Ω·cm can be obtained at room temperature (20±5° C.).

Also, so far as the area ratio and content of the carbon based component contained in the sputtering composite target fall within the foregoing ranges, a transparent conductive film having a transmittance of 80% or more can be obtained.

Figure 3:
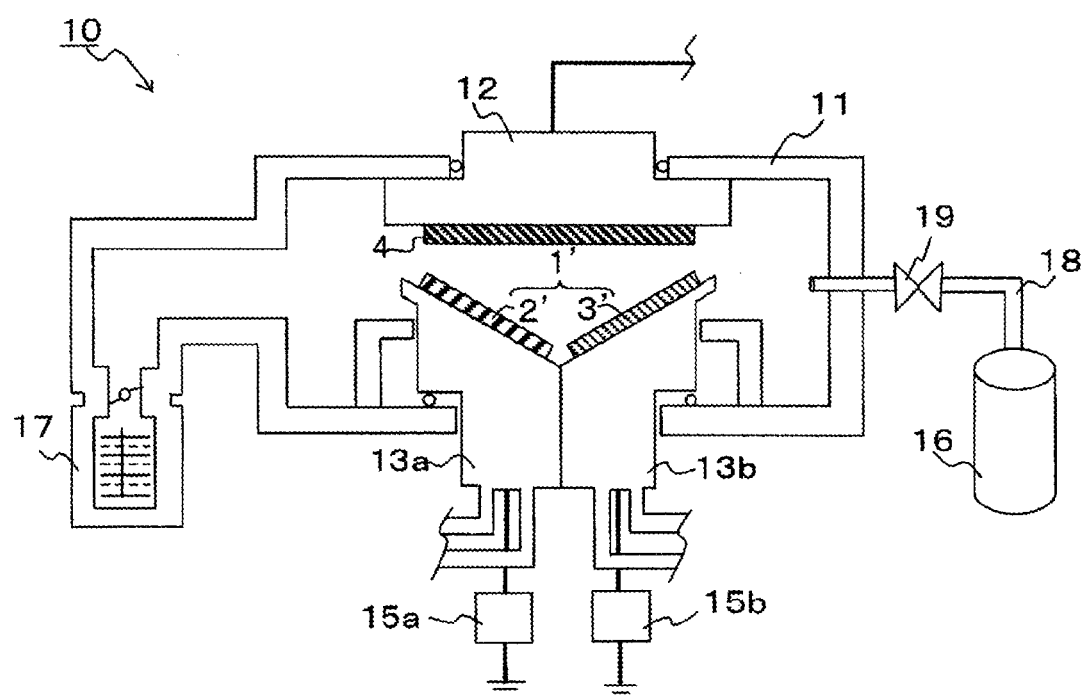
FIG. 3 is a view showing a diagrammatic configuration of an RF magnetron sputtering apparatus of other example.

The transparent conductive film can also be manufactured using an RF magnetron sputtering apparatus illustrated in FIG. 3.

FIG. 3 is a view showing a diagrammatic configuration of the RF magnetron sputtering apparatus 10 of other example. In FIG. 3, the same components as those in FIG. 2 are given the same symbols.

The RF magnetron sputtering apparatus 10 illustrated in FIG. 3 is provided with two target holders 13a, 13b for disposing a first target 2' containing an oxide based component and a second target 3' containing a carbon based component in a different position from each other.

The first target 2' and the second target 3' may be set in these two target holders 13a, 13b, respectively to form a sputtering composite target 1', thereby sputtering the first target 2' and the second target 3' together substantially at the same time.

For the purpose of forming a uniform transparent conductive film, the substrate holder 12 may be rotated at a prescribed rate.

Also, FIG. 3 illustrates an example in which power sources 15a, 15b are connected to the target holders 13a, 13b, respectively. However, a voltage may be applied to both the target holders 13a, 13b from a single power source.

Also, the sputtering composite target 1 is not limited to those illustrated in FIGS. 1 to 3, and an integrated body of the oxide based component 2 and the carbon based component 3 may be used.

The transparent conductive film-provided base material according to an embodiment of the present invention is representatively one obtained by each of the foregoing manufacturing methods and is a transparent conductive film-provided base material obtained by forming an ITO transparent conductive film on a film or a sheet made of a plastic having no heat resistance, for example, polyethylene, polypropylene, polyethylene terephthalate, etc.

According to embodiments of the present invention, a fixed amount of oxygen vacancies can be stably introduced into the transparent conductive film under a condition under which the substrate is kept at room temperature without being heated. Accordingly, it is possible to form an ITO transparent conductive film with low electrical resistance and good conductivity for not only glass substrates which have hitherto been used but the foregoing substrates with low heat resistance, such as plastic films or sheets. Thus, the foregoing transparent conductive film-provided substrate has been realized.

The transparent conductive film obtained according to embodiments of the present invention can be suitably used for solar cells and FPD (flat panel display) including LCD (liquid crystal display) and PDP (plasma display panel).

EXAMPLES

Embodiments of the present invention are hereunder described in more detail with reference to the following Examples and Comparative Examples, but it should not be construed that the embodiments of the present invention are limited to these Examples.

Example 1

By using the RF (radio-frequency) magnetron sputtering apparatus illustrated in FIG. 2, an oxide based (ITO) component which is a sintered body made of ITO and having a diameter of 4 inches and a thickness of 4 mm was set in the target holder.

A carbon chip (C) was set on this ITO component in an area ratio of 6% relative to 100% of a target surface area which is the maximum surface area of the ITO component, thereby forming a sputtering composite target.

Subsequently, a glass substrate having a thickness of 1 mm was set in the substrate holder.

Then, after evacuating the inside of the chamber by the vacuum pump, an Ar gas as a sputtering gas was introduced into the chamber at a flow rate of 15 sccm and a gas pressure of 1 Pa.

Thereafter, a voltage with high frequency (13.56 MHz) was applied between the substrate and the sputtering composite target from a power source of 50 W at room temperature (20±5° C.) without heating the substrate, and sputtering was performed for a sputtering time of 10 minutes, thereby forming a transparent conductive film having a thickness of 200 nm on the substrate.

The obtained transparent conductive film was measured for electrical resistance by a measuring device by a four-terminal process. As a result, the transparent conductive film had an electrical resistance of $2.0 \times 10^{-4}$ Ω·cm. Also, the transparent conductive film had a transmittance of 88%.

Even in the case where after performing sputtering for 50 hours in total, the sputtering was continued for 10 minutes in the same manner as described above to manufacture a transparent conductive film, the transparent conductive film had an electrical resistance of about $2 \times 10^{-4}$ Ω·cm and a transmittance of 88%. In view of this fact, there was confirmed reproducibility.

Example 2

A transparent conductive film was formed in the same manner as in Example 1, except for using, as the sputtering composite target, one prepared by setting a carbon chip (C) in an area ratio of 2% relative to 100% of a target surface area of the same ITO component as in Example 1.

As a result, the transparent conductive film had an electrical resistance of $3 \times 10^{-4}$ Ω·cm and a transmittance of 90%. Also, there was confirmed reproducibility.

Example 3

A transparent conductive film was formed in the same manner as in Example 1, except for using, as the sputtering composite target, one prepared by setting a carbon chip (C) in an area ratio of 15% relative to 100% of a target surface area of the same ITO component as in Example 1.

As a result, the transparent conductive film had an electrical resistance of $4\times10^{-4}$ Ω·cm and a transmittance of 85%.

Example 4

A transparent conductive film was formed in the same manner as in Example 1, except for setting a polypropylene (PP) based film having a thickness of 0.15 mm in the substrate holder.

As a result, the transparent conductive film had an electrical resistance of $4\times10^{-4}$ Ω·cm. Also, there was confirmed reproducibility.

Deformation or the like was not observed in the film substrate, and it was confirmed that the film was free from influences by heat in the sputtering process.

Example 5

A transparent conductive film was formed in the same manner as in Example 2, except for setting a polypropylene (PP) based film having a thickness of 0.30 mm in the substrate holder.

As a result, the transparent conductive film had an electrical resistance of $4\times10^{-4}$ Ω·cm. Also, there was confirmed reproducibility.

Deformation or the like was not observed in the film substrate, and it was confirmed that the film was free from influences by heat in the sputtering process.

Example 6

A transparent conductive film was formed in the same manner as in Example 3, except for setting a polypropylene (PP) based film having a thickness of 0.50 mm in the substrate holder.

As a result, the transparent conductive film had an electrical resistance of $4\times10^{-4}$ Ω·cm. Also, there was confirmed reproducibility.

Deformation or the like was not observed in the film substrate, and it was confirmed that the film was free from influences by heat in the sputtering process.

Example 7

A transparent conductive film was formed in the same manner as in Example 1, except for setting a polyethylene terephthalate (PET) film having a thickness of 100 μm in the substrate holder.

As a result, the transparent conductive film had an electrical resistance of $4\times10^{-4}$ Ω·cm and a transmittance of 85%. Also, there was confirmed reproducibility.

Deformation or the like was not observed in the film substrate, and it was confirmed that the film was free from influences by heat in the sputtering process.

Example 8

A transparent conductive film was formed in the same manner as in Example 2, except for setting a polyethylene terephthalate (PET) film having a thickness of 125 μm in the substrate holder.

As a result, the transparent conductive film had an electrical resistance of $4\times10^{-4}$ Ω·cm and a transmittance of 84%. Also, there was confirmed reproducibility.

Deformation or the like was not observed in the film substrate, and it was confirmed that the film was free from influences by heat in the sputtering process.

Example 9

A transparent conductive film was formed in the same manner as in Example 3, except for setting a polyethylene terephthalate (PET) film having a thickness of 250 μm in the substrate holder.

As a result, the transparent conductive film had an electrical resistance of $4\times10^{-4}$ Ω·cm and a transmittance of 80%. Also, there was confirmed reproducibility.

Deformation or the like was not observed in the film substrate, and it was confirmed that the film was free from influences by heat in the sputtering process.

Example 10

A transparent conductive film was formed in the same manner as in Example 1, except for setting a polyethylene (PE) sheet having a thickness of 0.5 mm in the substrate holder.

As a result, the transparent conductive film had an electrical resistance of $4\times10^{-4}$ Ω·cm. Also, there was confirmed reproducibility.

Deformation or the like was not observed in the film substrate, and it was confirmed that the film was free from influences by heat in the sputtering process.

Example 11

A transparent conductive film was formed in the same manner as in Example 2, except for setting a polyethylene (PE) sheet having a thickness of 1.0 mm in the substrate holder.

As a result, the transparent conductive film had an electrical resistance of $4\times10^{-4}$ Ω·cm. Also, there was confirmed reproducibility.

Deformation or the like was not observed in the film substrate, and it was confirmed that the film was free from influences by heat in the sputtering process.

Example 12

A transparent conductive film was formed in the same manner as in Example 3, except for setting a polyethylene (PE) sheet having a thickness of 2.0 mm in the substrate holder.

As a result, the transparent conductive film had an electrical resistance of $4\times10^{-4}$ Ω·cm. Also, there was confirmed reproducibility.

Deformation or the like was not observed in the film substrate, and it was confirmed that the film was free from influences by heat in the sputtering process.

Examples 13 to 15

Transparent conductive films were formed in the same manner as in Example 1, except for using a sputtering composite target obtained by mixing powders of ITO and C (graphite) in a ratio as described below and integrating the mixture by means of sintering or the like.
Example 13: ITO/C (graphite)=99.4%/0.6%
Example 14: ITO/C (graphite)=98.0%/2.0%
Example 15: ITO/C (graphite)=94.7%/5.3%

In the sputtering targets of the foregoing Examples 13 to 15, the proportion of the area occupied by C is corresponding to 2%, 6% and 15%, respectively.

The transparent conductive films obtained by using the sputtering composite targets of Examples 13 to 15 had an electrical resistance of $3 \times 10^{-4}$ Ω·cm (Example 13), $2 \times 10^{-4}$ Ω·cm (Example 14) and $4 \times 10^{-4}$ Ω·cm (Example 15), respectively.

Also, the transparent conductive films of Examples 13 to 15 had a transmittance of 90%, 88% and 85%, respectively.

Comparative Example 1

A transparent conductive film was formed in the same manner as in Example 1, except for using, as the sputtering target, a sintered body made of ITO and having a diameter of 4 inches and a thickness of 4 mm.

The obtained transparent conductive film had an electrical resistance of $8 \times 10^{-3}$ Ω·cm and a transmittance of 88%.

Comparative Example 2

A transparent conductive film was formed in the same manner as in Example 1, except for using, as the sputtering target, one obtained by setting a carbon chip (C) on an ITO component having a diameter of 4 inches and a thickness of 4 mm in an area ratio of 20% relative to 100% of the maximum surface area of the ITO component.

The obtained transparent conductive film had an electrical resistance of $2 \times 10^{-3}$ Ω·cm and a transmittance of 76%.

Consideration of the Results

All of the transparent conductive films manufactured using the sputtering composite targets of Examples 1 to 15 had a low electrical resistance as not more than $4 \times 10^{-4}$ Ω·cm, and a transparent conductive film with low electrical resistance and good conductivity could be obtained at room temperature without heating the substrate at a high temperature (for example, 200° C.).

Also, even after performing sputtering for 50 hours, the electrical resistance of the obtained transparent conductive films did not change as being not more than $4 \times 10^{-4}$ Ω·cm, and it could be confirmed that the reproducibility of sputtering was good.

On the other hand, when the sputtering targets of Comparative Examples 1 and 2 were used, the electrical resistance of the obtained transparent conductive films was high as $8 \times 10^{-3}$ Ω·cm and $2 \times 10^{-3}$ Ω·cm, respectively, and a transparent conductive film having electrical resistance on required levels could not be obtained.

The present application contains subject matter related to that disclosed in Japanese Priority Patent Application JP 2008-149620 filed in the Japan Patent Office on Jun. 6, 2008, the entire contents of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A sputtering composite target comprising:
an oxide-based component containing indium oxide and having a target surface area; and
a carbon-based component laminated on at least a portion of the target surface area of the oxide-based component such that an area ratio occupied by the carbon-based component is from 2 to 15% relative to 100% of the target surface area;
wherein the carbon-based component comprises at least one of a carbon powder, a carbon chip and a carbide material including at least one of $Al_4C_3$, NbC, TaC and ZrC.

2. The sputtering composite target according to claim 1, wherein the sputtering composite target comprises at least one element selected from the group consisting of tin, zinc, tungsten and germanium.

3. The sputtering composite target according to claim 2, wherein a proportion of a content of the element is from 1.0 to 30.0% by mass.

4. The sputtering composite target according to claim 1, wherein a content of the carbon-based component is from 0.6 to 6.0 parts by weight based on 100 parts by weight of the oxide-based component.

5. The sputtering composite target according to claim 1, wherein the oxide-based component is a sintered body, and the carbon-based component is a non-sintered body.

6. The sputtering composite target according to claim 1, further comprising a metal element comprising at least one of tin, zinc, tungsten and germanium.

7. A method for manufacturing a transparent conductive film comprising the act of:
forming a transparent conductive film on a substrate using a sputtering composite target comprising an oxide-based component containing indium oxide having a target surface area and a carbon-based component laminated on at least a portion of the target surface area of the oxide-based component such that an area ratio occupied by the carbon-based component is from 2 to 15% relative to 100% of the target surface area;
wherein forming a transparent conductive film on a substrate comprises introducing a sputtering gas into a chamber at a gas flow rate of from 5 to 50 sccm.

8. The method for manufacturing a transparent conductive film according to claim 7, wherein the substrate is a sheet or film of a plastic.

9. The method for manufacturing a transparent conductive film according to claim 7, wherein the substrate is not heated.

10. The method for manufacturing a transparent conductive film of claim 7, wherein forming a transparent conductive film on a substrate comprises maintaining a gas pressure from 0.5 to 2.0 Pa within the chamber.

11. The method for manufacturing a transparent conductive film of claim 7, wherein forming a transparent conductive film on a substrate comprises maintaining the substrate at room temperature.

12. A sputtering composite target comprising:
an oxide-based component containing indium oxide and having a target surface area;
a carbon-based component laminated on at least a portion of the target surface area of the oxide-based component such that an area ratio occupied by the carbon-based component is from 2 to 15% relative to 100% of the target surface area;
wherein the carbon-based component comprises at least one of a carbon powder, a carbon chip and a carbide materials including at least one of $Al_4C_3$, NbC, TaC and ZrC;
wherein the oxide-based component comprises a disc shape; and
wherein the carbon-based component comprises at least one sector shape disposed on a surface of the disc shaped oxide-based component and having a prescribed angle.

* * * * *